(12) United States Patent
Nammi

(10) Patent No.: US 10,389,487 B2
(45) Date of Patent: Aug. 20, 2019

(54) ADAPTIVE DOWNLINK CONTROL CHANNEL STRUCTURE FOR 5G OR OTHER NEXT GENERATION NETWORKS

(71) Applicant: AT&T INTELLECTUAL PROPERTY I, L.P., Atlanta, GA (US)

(72) Inventor: SaiRamesh Nammi, Austin, TX (US)

(73) Assignee: AT&T Intellectual Property I, L.P., Atlanta, GA (US)

(*) Notice: Subject to any disclaimer, the term of this patent is extended or adjusted under 35 U.S.C. 154(b) by 198 days.

(21) Appl. No.: 15/408,202

(22) Filed: Jan. 17, 2017

(65) Prior Publication Data

US 2018/0205395 A1    Jul. 19, 2018

(51) Int. Cl.
*H03M 13/29* (2006.01)
*H04W 72/04* (2009.01)
(Continued)

(52) U.S. Cl.
CPC .......... *H04L 1/1812* (2013.01); *H04L 1/0058* (2013.01); *H04L 1/1816* (2013.01);
(Continued)

(58) Field of Classification Search
CPC ......... H03M 13/1102; H03M 13/1105; H03M 13/13; H03M 13/23; H03M 13/2906;
(Continued)

(56) References Cited

U.S. PATENT DOCUMENTS 7,986,741 B2    7/2011    Tsai et al.
8,189,559 B2    5/2012    Pi et al.
(Continued)

FOREIGN PATENT DOCUMENTS

AU        545194 B2      7/1985
CN     103840912 A      6/2014
(Continued)

OTHER PUBLICATIONS

Cabrera, "Adaptive HARQ (AHARQ) for ultrareliable communicationin 5G." (2015).
(Continued)

*Primary Examiner* — Christian M Dorman
(74) *Attorney, Agent, or Firm* — Amin, Turocy & Watson, LLP

(57) ABSTRACT

An adaptive downlink control channel structure is provided to enable a transmitter to switch between forward error correction codes that use either Chase combining or incremental redundancy hybrid automatic repeat request (HARQ) techniques. Chase combining HARQ can be more efficient for forward error correction codes that use higher code rates, while incremental redundancy can be more effective for forward error correction codes that use lower code rates. The transmitter will also selectively comprise the redundancy version indicator bits depending on the HARQ method selected, which can reduce the sizes of the transport blocks when not using incremental redundancy. A receiver device can also decode transport blocks and determine whether a redundancy version indicator is present based on the forward error correction code selected.

20 Claims, 12 Drawing Sheets

(51) Int. Cl.
*H04L 1/00* (2006.01)
*H03M 13/23* (2006.01)
*H03M 13/11* (2006.01)
*H03M 13/13* (2006.01)
*H04L 1/18* (2006.01)
*H03M 13/35* (2006.01)
*H03M 13/00* (2006.01)

(52) U.S. Cl.
CPC .......... *H04L 1/1819* (2013.01); *H04L 1/1825* (2013.01); *H03M 13/1102* (2013.01); *H03M 13/13* (2013.01); *H03M 13/2957* (2013.01); *H03M 13/353* (2013.01); *H03M 13/6306* (2013.01); *H04L 1/001* (2013.01); *H04L 1/007* (2013.01); *H04L 1/0045* (2013.01); *H04L 1/0046* (2013.01); *H04L 1/0056* (2013.01); *H04L 1/0086* (2013.01); *H04L 1/0088* (2013.01); *H04L 1/0089* (2013.01); *H04L 1/0091* (2013.01); *H04W 72/042* (2013.01)

(58) Field of Classification Search
CPC ............. H03M 13/2927; H03M 13/35; H03M 13/353; H04W 72/042; H04L 1/0045; H04L 1/0046; H04L 1/0056; H04L 1/0058; H04L 1/007; H04L 1/0086; H04L 1/0088; H04L 1/0091; H04L 1/1812; H04L 1/1816; H04L 1/1819
See application file for complete search history.

(56) References Cited

U.S. PATENT DOCUMENTS

| | | | |
|---|---|---|---|
| 8,433,987 B2 | 4/2013 | Fan et al. | |
| 8,520,496 B2 | 8/2013 | Nimbalker et al. | |
| 8,667,357 B2 | 3/2014 | Park | |
| 8,780,820 B2 | 7/2014 | Yoo | |
| 8,787,241 B2 | 7/2014 | Pinheiro et al. | |
| 8,942,208 B2 | 1/2015 | Luo et al. | |
| 8,958,330 B2 | 2/2015 | Ling | |
| 8,964,654 B2 | 2/2015 | Golitschek et al. | |
| 9,071,402 B2 | 6/2015 | Cheng | |
| 9,184,880 B2 | 11/2015 | Vos | |
| 9,320,024 B2 | 4/2016 | Lindh et al. | |
| 9,461,720 B2 | 10/2016 | Nammi et al. | |
| 9,485,059 B2 | 11/2016 | Peisa et al. | |
| 9,510,298 B2 | 11/2016 | Wu et al. | |
| 2013/0128828 A1* | 5/2013 | Baldemair | H04L 5/001 370/329 |
| 2014/0313908 A1 | 10/2014 | Da et al. | |
| 2015/0365198 A1 | 12/2015 | Tabet et al. | |
| 2016/0119105 A1 | 4/2016 | Jiang et al. | |
| 2016/0261383 A1 | 9/2016 | Bergstrom et al. | |
| 2016/0270116 A1 | 9/2016 | Lin et al. | |
| 2016/0302129 A1* | 10/2016 | Lohr | H04W 72/0446 |
| 2017/0214494 A1* | 7/2017 | Qiang | H04L 1/1692 |
| 2017/0353947 A1* | 12/2017 | Ang | H04B 7/0413 |

FOREIGN PATENT DOCUMENTS

| | | | | |
|---|---|---|---|---|
| WO | 2016072820 A1 | 5/2016 | | |
| WO | WO-2017156773 A1 * | 9/2017 | ........... | H04L 1/0057 |

OTHER PUBLICATIONS

Germany, Forschung EV HHI, and Alternatives CEA France. "5G Cellular Communications Scenarios and System Requirements." 2013.
Germany, Forschung EV HHI, and Alternatives CEA France. "Consistent 5G Radio Access Architecture Concepts." 2015.
Luo, et al. "MillimeterWave Airinterface for 5G: Challenges and Design Principles." Proc. ETSI Wksp. Future Radio Technologies Air Interfaces (2016):1-6.
Gorgoglione, et al. "Benefits and impact of cloud computing on 5G signal processing." (2014).

* cited by examiner

US 10,389,487 B2

ADAPTIVE DOWNLINK CONTROL CHANNEL STRUCTURE FOR 5G OR OTHER NEXT GENERATION NETWORKS

TECHNICAL FIELD

The disclosed subject matter relates to an adaptive downlink control channel structure that can use both Chase combining and Incremental Redundancy versions of Hybrid Automatic Repeat Request (HARQ) in a wireless system to enable improvement of wireless system performance over conventional wireless system technologies, e.g., for fifth generation (5G) technologies or other next generation networks.

BACKGROUND

To meet the huge demand for data centric applications, third generation partnership project (3GPP) systems and systems that employ one or more aspects of the specifications of fourth generation (4G) standards for wireless communications will be extended to fifth generation (5G) standards for wireless communications. Unique challenges exist to provide levels of service associated with forthcoming 5G and/or other next generation standards for wireless networks.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
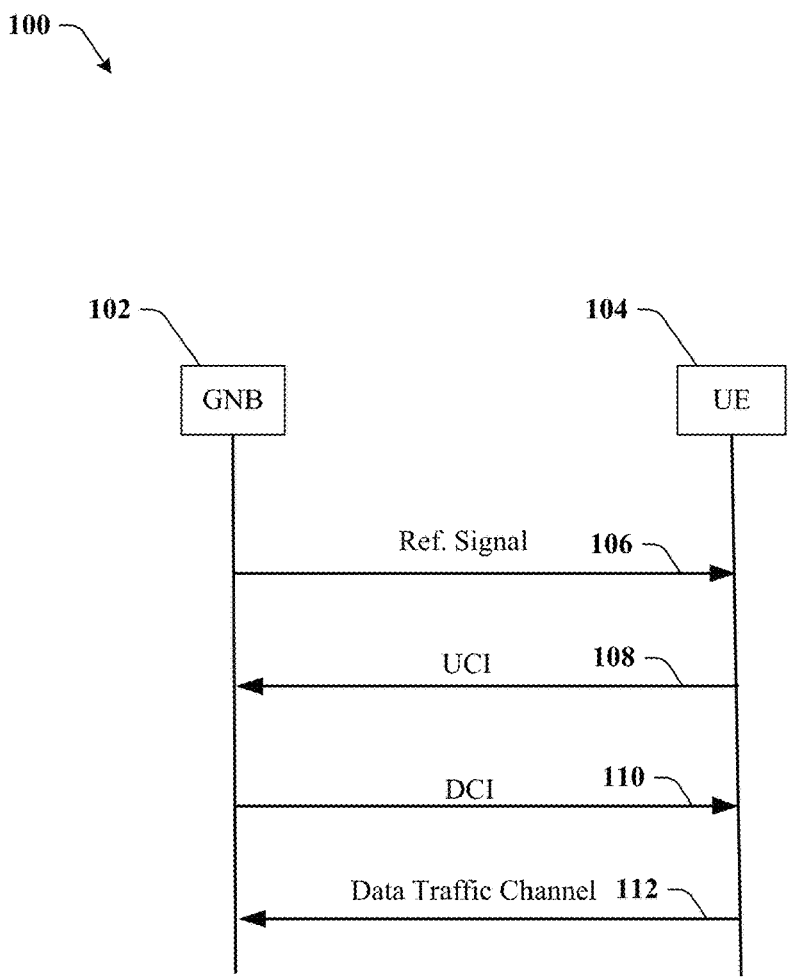
FIG. 1 illustrates an example schematic diagram of a message sequence chart for downlink control information in accordance with various aspects and embodiments of the subject disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details (and without applying to any particular networked environment or standard).

An adaptive downlink control channel structure is provided to enable a transmitter to switch between forward error correction codes that use either Chase combining or incremental redundancy hybrid automatic repeat request (HARQ) techniques. Chase combining HARQ can be more efficient for forward error correction codes that use higher code rates, while incremental redundancy can be more effective for forward error correction codes that use lower code rates. The transmitter will also selectively comprise the redundancy version indicator bits depending on the HARQ method selected, which can reduce the sizes of the transport blocks when not using incremental redundancy. A receiver device can also decode transport blocks and determine whether a redundancy version indicator is present based on the forward error correction code selected.

To at least these and related ends, a system can comprise a processor and a memory that stores executable instructions that, when executed by the processor, facilitate performance of operations, including receiving downlink control information to be transmitted to a mobile device. The operations can also comprise determining a first code rate of a first segment of the downlink control information and a second code rate of a second segment of the downlink control information. The operations can also comprise selecting a first forward error correction code for the first segment and a second forward error correction code for the second segment from a group of forward error correction codes based on the first code rate and the second code rate of the first segment and second segment respectively. The operations can also comprise determining whether a redundancy version indicator is to be added to the second segment based on the forward error correction code in the first segment.

In another embodiment, a method can comprise receiving, by a receiver device comprising a processor, a transport block associated with downlink control information. The method can also comprise determining, by the receiver device, a first code rate of the transport block, wherein the first code rate is associated with a forward error correction code used to encode the transport block. The method can also comprise decoding, by the receiver device, the transport block based on the forward error correction code, resulting in a decoded transport block. The method can also comprise interpreting, by the receiver device, a portion of bits in the decoded transport block as redundancy version bits in response to the first code rate being below a defined code rate.

In another embodiment, a machine-readable storage medium, comprising executable instructions that, when executed by a processor of a device, facilitate performance of operations. The operations can comprise receiving downlink control information to be transmitted to a mobile device. The operations can also comprise determining a first code rate of a first segment of the downlink control information. The operations can also comprise determining whether a redundancy version indicator is to be added to the first segment based on the first code rate, wherein a redundancy version indicator is added in response to the first code rate being determined to be slower than a defined code rate, and wherein the redundancy version indicator is not added in response to the first code rate being determined to be faster than the defined code rate. The operations can also comprise encoding the first segment with a forward error correction code selected based on the first code rate.

Turning now to FIG. 1, illustrated is an example schematic diagram 100 of a message sequence chart for uplink control information in accordance with various aspects and embodiments of the subject disclosure. In an embodiment, a gNodeB 102 can send a reference signal 106 to a UE 104. The reference signal can be beamformed in some embodiments, or non beamformed in other embodiments.

Based on the reference signal 106, the UE 104 can measure the channel response, and determine channel state information (CSI) to give as feedback to the gNodeB 102. The channel state information can comprise a channel quality indicator, precoding matrix index, or advanced PMI. This channel state information can refer to the known channel properties of the communication link between the gNodeB 102 and the UE 104. The channel properties can reflect how the signal propagates from the transmitter to the receiver and represents the combined effect of, for example, scattering, fading, and power decay with distance. The method is called Channel estimation. The CSI makes it possible to adapt transmissions to current channel conditions.

Once the channel state information is assembled, the UE 104 can transmit the UCI 108 to the gNodeB 102. Based, on the UCI 108, the gNodeB 102 can then send downlink control information (DCI) 110 to the UE 104 which enables the UE to send the data over the data traffic channel 112. The downlink control information 110 can be encoded with a forward error correction code that is selected from one of several forward error correction codes based on various conditions present, including amount of data, code rate, channel conditions, etc. The forward error correction codes can comprise Turbo convolution codes, or Low Density Parity Check (LDPC) Type 1 or 2 codes, or Polar codes.

Turbo convolution codes are codes where two convolution codes are concatenated in parallel and iterative decoding is applied at the receiver. LDPC codes are a class of linear block codes where the parity check matrix is sparse (low density of 1 s). When iterative decoding is applied at the receiver, these codes are known to perform close to Shannon capacity with less decoding complexity. Polar codes achieve the symmetric capacity of arbitrary binary-input discrete memoryless channels under a low complexity successive cancellation decoding strategy.

Comparing all the three forward error correction codes in additive white Gaussian noise channels, it was observed that each of the codes perform optimally using different modulation schemes and code rates. Turbo codes and LDPC type 2 often perform better at low code rates with low modulation orders. LDPC type 1 codes perform better at higher code rates and with higher modulation schemes. Performance of polar codes is better with lower data block sizes with high complexity. Hence one single forward error correction code can't perform well over wide code rate ranges and for all modulations.

Hybrid automatic repeat request (HARQ) is used in wireless systems to overcome transmission errors that cannot be corrected using forward error correcting code (channel code). In a typical implementation of the HARQ process, each data packet to be transmitted by a transmitter, e.g., gNodeB 102 in DCI 110, is attached with a cyclic redundancy check (CRC) code for error detection. At the UE 104, the contents of the each received packet are validated using CRC. If the received packet fails the CRC validation, the UE 104 sends a non-acknowledgement (NAK) signal back to the transmitter to request a retransmission. The packets are retransmitted by the gNodeB 102 until either they are decoded successfully or until the maximum number of retransmissions (e.g. 4-6 retransmissions) is reached. Otherwise, if the received packet is successfully validated using the CRC validation, an acknowledgement (ACK) signal is sent back to the gNodeB 102 to acknowledge correct decoding of data packets. At the UE 104, the received retransmitted packets and the received originally transmitted packets are combined to improve the system throughput. Depending on the way the packets are combined HARQ systems can be typically classified into two categories namely, Chase combining (CC) or Incremental Redundancy (IR).

In Chase combining: every re-transmission contains the same information (data and parity bits). The receiver uses maximum-ratio combining to combine the received bits with the same bits from previous transmissions. Because all transmissions are identical, Chase combining can be seen as additional repetition coding. One could think of every re-transmission as adding extra energy to the received transmission through an increased Eb/N.

In Incremental redundancy: every re-transmission contains different information than the previous one. Multiple sets of coded bits are generated, each representing the same set of information bits. The re-transmission typically uses a different set of coded bits than the previous transmission, with different redundancy versions generated by puncturing the encoder output. Thus, at every re-transmission the receiver gains extra information.

When using Chase combining, LDPC type 1 and Polar codes perform better, whereas with incremental redundancy, Turbo codes and LDPC type 2 codes perform more efficiently. Therefore, according to an embodiment of the disclosure, when DCI 110 is transmitted at code rates below a predetermined threshold, HARQ-IR is to be used, whereas if DCI is transmitted at code rates above the threshold HARQ-CC is used. The threshold is the code at which it becomes more efficient to use Polar codes or LDPC-1 codes, and can vary based on the codes selected.

When using incremental redundancy, a portion of the transport block comprises a set of bits that are used to indicate which redundancy version (RV) the transport block is to allow the receiver to reconstruct the information during the HARQ process. When using Chase combining, however, there is no need for the RV block. Therefore, in an embodiment of the disclosure, the transmitter device can save space by not incorporating a RV block into the transport block when transmitting packets using LDPC type 1 or Polar codes, and the receiver can interpret the transport block as having RV indicators when the code rate of the block is below a predetermined threshold, and Turbo or LDPC type 1 codes are used to encode the block.

Figure 2:
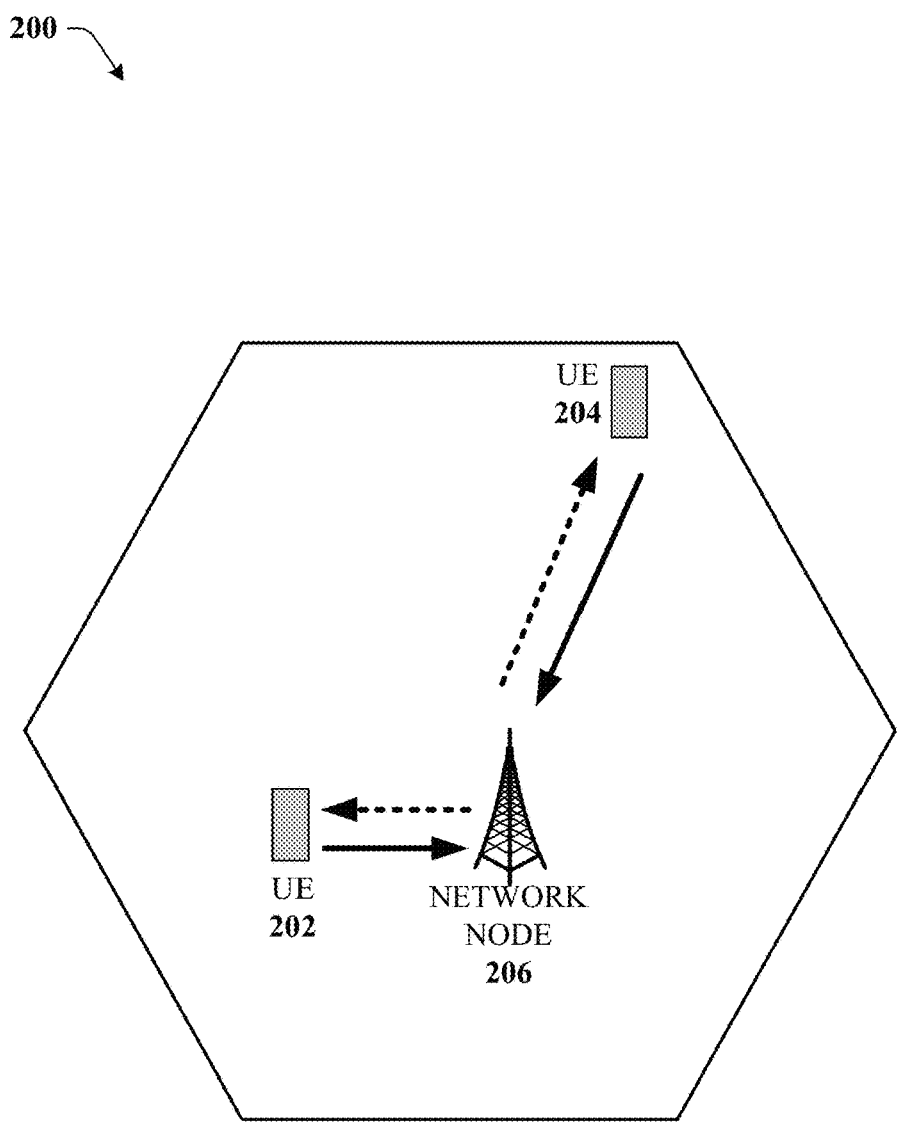
FIG. 2 illustrates an example block diagram of a wireless communication system that facilitates adaptive downlink control channel structure in accordance with various aspects and embodiments of the subject disclosure.

Turning now to FIG. 2, illustrated is an example block diagram of a wireless communication system 200 that facilitates adaptive downlink control channel structure in accordance with various aspects and embodiments of the subject disclosure. In one or more embodiments, system 200 can comprise one or more user equipment UEs 204 and 202, which can have one or more antenna panels having vertical and horizontal elements. A UE 202 can be a mobile device such as a cellular phone, a smartphone, a tablet computer, a wearable device, a virtual reality (VR) device, a heads-up display (HUD) device, a smart car, a machine-type communication (MTC) device, and the like. User equipment UE 202 can also comprise IOT devices that communicate wirelessly. In various embodiments, system 200 is or comprises a wireless communication network serviced by one or more wireless communication network providers. In example embodiments, a UE 202 can be communicatively coupled to the wireless communication network via a network node or base station device 206.

The non-limiting term network node (or radio network node) is used herein to refer to any type of network node serving a UE 202 and UE 204 and/or connected to other network node, network element, or another network node from which the UE 202 or 204 can receive a radio signal. Network nodes can also have multiple antennas for performing various transmission operations (e.g., MIMO operations). A network node can have a cabinet and other protected enclosures, an antenna mast, and actual antennas. Network nodes can serve several cells, also called sectors, depending on the configuration and type of antenna. Examples of network nodes (e.g., network node 206) can comprise but are not limited to: NodeB devices, base station (BS) devices, access point (AP) devices, and radio access network (RAN) devices. The network node 206 can also comprise multi-standard radio (MSR) radio node devices, including but not limited to: an MSR BS, an eNode B, a network controller, a radio network controller (RNC), a base station controller (BSC), a relay, a donor node controlling relay, a base transceiver station (BTS), a transmission point, a transmission node, an RRU, an RRH, nodes in distributed antenna system (DAS), and the like. In 5G terminology, the node 206 can be referred to as a gNodeB device.

In example embodiments, the UE 202 and 204 can send and/or receive communication data via a wireless link to the network node 206. The dashed arrow lines from the network node 206 to the UE 202 and 204 represent downlink (DL) communications and the solid arrow lines from the UE 202 and 204 to the network nodes 206 represents an uplink (UL) communication.

Wireless communication system 200 can employ various cellular technologies and modulation schemes to facilitate wireless radio communications between devices (e.g., the UE 202 and 204 and the network node 206). For example, system 200 can operate in accordance with a UMTS, long term evolution (LTE), high speed packet access (HSPA), code division multiple access (CDMA), time division multiple access (TDMA), frequency division multiple access (FDMA), multi-carrier code division multiple access (MC-CDMA), single-carrier code division multiple access (SC-CDMA), single-carrier FDMA (SC-FDMA), OFDM, (DFT)-spread OFDM or SC-FDMA)), FBMC, ZT DFT-s-OFDM, GFDM, UFMC, UW DFT-Spread-OFDM, UW-OFDM, CP-OFDM, resource-block-filtered OFDM, and UFMC. However, various features and functionalities of system 200 are particularly described wherein the devices (e.g., the UEs 202 and 204 and the network device 206) of system 200 are configured to communicate wireless signals using one or more multi carrier modulation schemes, wherein data symbols can be transmitted simultaneously over multiple frequency subcarriers (e.g., OFDM, CP-OFDM, DFT-spread OFMD, UFMC, FMBC, etc.).

In various embodiments, system 200 can be configured to provide and employ 5G wireless networking features and functionalities. 5G wireless communication networks are expected to fulfill the demand of exponentially increasing data traffic and to allow people and machines to enjoy gigabit data rates with virtually zero latency. Compared to 4G, 5G supports more diverse traffic scenarios. For example, in addition to the various types of data communication between conventional UEs (e.g., phones, smartphones, tablets, PCs, televisions, Internet enabled televisions, etc.) supported by 4G networks, 5G networks can be employed to support data communication between smart cars in association with driverless car environments, as well as machine type communications (MTCs). Considering the drastic different communication needs of these different traffic scenarios, the ability to dynamically configure waveform parameters based on traffic scenarios while retaining the benefits of multi carrier modulation schemes (e.g., OFDM and related schemes) can provide a significant contribution to the high speed/capacity and low latency demands of 5G networks. With waveforms that split the bandwidth into several sub-bands, different types of services can be accommodated in different sub-bands with the most suitable waveform and numerology, leading to an improved spectrum utilization for 5G networks.

In various embodiments, the network node 206 can select a forward error correction code to be used to encode downlink control information that will be transmitted to either UE 202 or UE 204. The forward error correction code selected can be selected upon the basis of the network conditions, modulation scheme, or code rate required for the transmission. In an embodiment, the forward error correction code can be at least one of turbo codes, LDPC type 1 or type 2 codes, or Polar codes. LDPC type 2 and turbo codes can be selected when the code rate is below one or more predefined thresholds, while LDPC type 1 or Polar codes can be selected when the code rate is above the one or more predetermined thresholds. When the LDPC type 2 or Turbo codes are used, the network node 206 can adaptively structure the transport blocks such that RV code blocks can be incorporated to support HARQ incremental redundancy, whereas, when LDPC type 1 or Polar codes are used, the network node 206 can adaptively structure the transport blocks such that no RV code blocks are incorporated since HARQ Chase combining will be used, and Chase combining does not need the RV code block since the same transport blocks are resent in the case of errors.

The UE 202 and 204, when receiving the DCI transport blocks can decode the blocks using the forward error correcting code, and check the parity bits for errors. Based on the code rate, or based on the forward error correcting code, the UE 202 and 204 can determine whether or not the RV block is present when interpreting the bits in the transport block. If the RV block is present, the UE 202 or 204 can use the version information included in the RV block to facilitate the HARQ incremental redundancy process, whereas, if the RV block is not present, the UE 202 or 204 will use Chase combining when performing HARQ.

Figure 3:
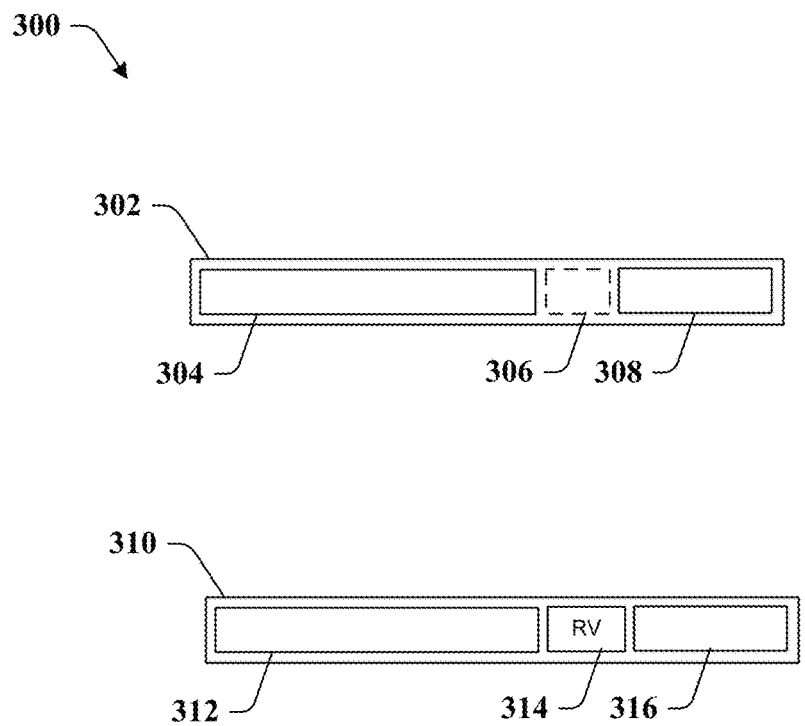
FIG. 3 illustrates an example block diagram of downlink control channel transport blocks that can supports Chase combining and Incremental Redundancy HARQ in accordance with various aspects and embodiments of the subject disclosure.

Turning now to FIG. 3, illustrated is an example block diagram 300 of downlink control channel transport blocks 302 and 310 that can support Chase combining and Incremental Redundancy HARQ in accordance with various aspects and embodiments of the subject disclosure.

In an embodiment, transport block 302 can be encoded using a code rate that is above a predefined threshold, and with a Polar or LDPC type 1 forward error correction code. Since chase combining performs better than incremental redundancy for HARQ in terms of speed, efficiency and resources consumed, transport block doesn't require an RV codeblock at 306. Instead, the portions of downlink control information 304 and 308 that can comprise Localized/Distributed VRB assignment flag, Resource block assignment, Modulation and coding scheme, HARQ process number, New data indicator, TPC command for uplink control channel, Downlink Assignment Index, Precoding matrix index, and Number of layers can be encoded and transmitted. The size of the transport block can thus be reduced by not incorporating the RV code block.

By contrast, in transport block 310, Turbo or LDPC type 2 forward error correction codes may be selected based on the code rate being below a predetermined threshold. In this embodiment, in between downlink control information portions 312, and 316, the transmitter can comprise the RV code block 314, with the bits set to the version of the transport block 310, to facilitate HARQ incremental redundancy.

Figure 4:
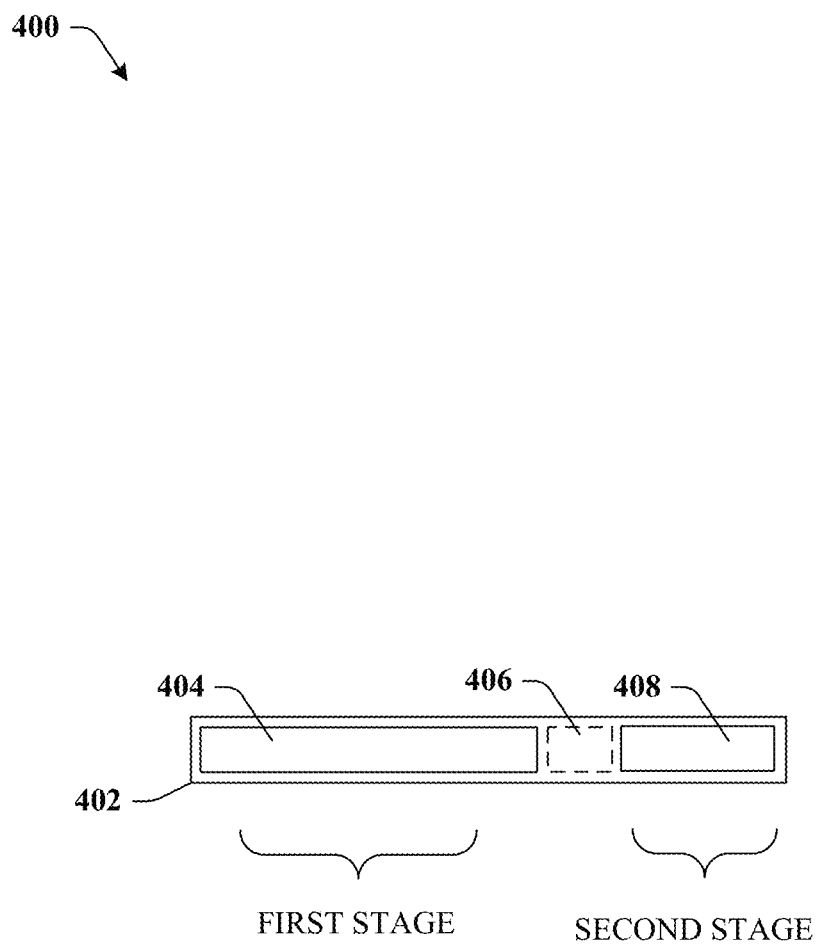
FIG. 4 illustrates an example block diagram of an adaptive downlink control channel structure in accordance with various aspects and embodiments of the subject disclosure.

Turning now to FIG. 4, illustrated is an example block diagram 400 of an adaptive downlink control channel structure in accordance with various aspects and embodiments of the subject disclosure. In an embodiment, the transmitter or network node can dynamically adjust the code rate and/or forward error correction code used from one transmit time interval (TTI) to another, or from one subframe or slot to the next subframe or slot. For example, if the transmitter at TTI1, uses a high code rate forward error correction code such as LDPC type 1 that uses HARQ-CC, and at TTI2 uses a low rate Turbo code that uses HARQ-IR, the presence of the RV block in TTI2 depends on the contents and FEC code of TTI1.

As shown in FIG. 4, for instance, if the first stage 404 of the downlink control information 402 is encoded with a Turbo code, then the RV block 406 is present when transmitting the second stage 408. On the other hand, if the first stage 404 is encoded with a high code rate code such as LDPC type 1, or Polar codes, then the RV block 406 is not present, and the size of the total DCI information 402 is reduced, leading to less resources used in transmitting the DCI 402.

Figure 5:
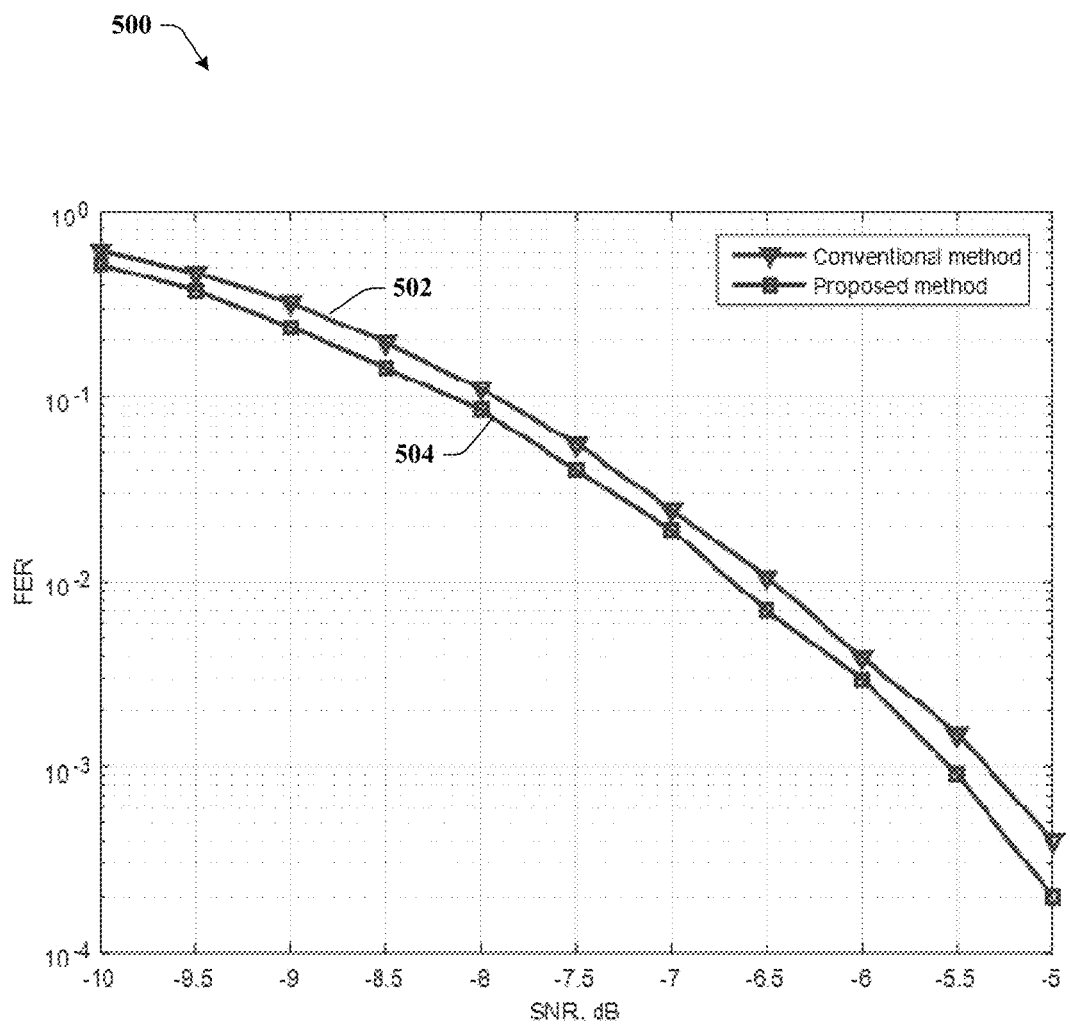
FIG. 5 illustrates an example graph showing a performance of the adaptive downlink control channel structure in accordance with various aspects and embodiments of the subject disclosure.

As can be seen in FIG. 5, the experimental results showing power consumption over a range of signal to noise ratios shows that a conventional method 502 has a higher frame error rate at a similar signal to noise ratio (SNR) over a range of SNR.

Figure 6:
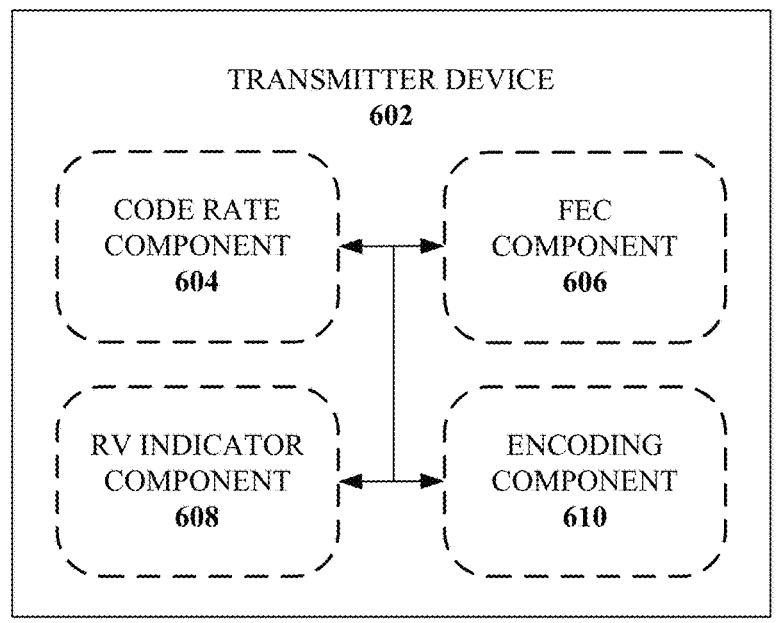
FIG. 6 illustrates an example block diagram of a transmitter device that facilitates an adaptive downlink control channel structure in accordance with various aspects and embodiments of the subject disclosure.

Turning now to FIG. 6, illustrated is an example block diagram 600 of a transmitter device 602 that facilitates an adaptive downlink control channel structure in accordance with various aspects and embodiments of the subject disclosure. Transmitter device 602 can comprise a code rate component 604 that can determine a first code rate of a first segment and a second code rate of a second segment of the downlink control information to be transmitted to a mobile device. The transmitter device 602 can also comprise an FEC component 606 that can select a first forward error correction code for the first segment and a second forward error correction code for the second segment from a group of forward error correction codes based on the first code rate and the second code rate of the first segment and second segment respectively. The transmitter device can also comprise an RV indicator component 608 that determines whether a redundancy version indicator is to be added to the second segment based on the forward error correction code in the first segment. The encoding component 610 can then encode the segments with the forward error correction code selected before transmission to the mobile device.

Figure 7:
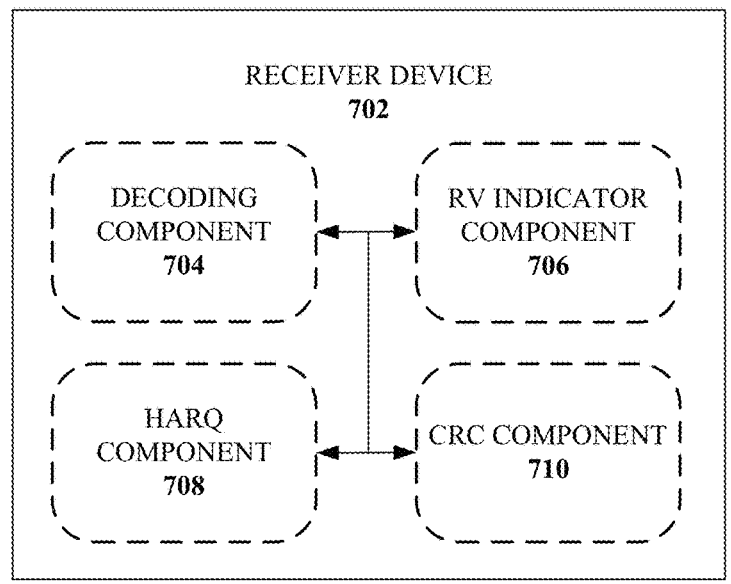
FIG. 7 illustrates an example block diagram of a receiver device that facilitates an adaptive downlink control channel structure in accordance with various aspects and embodiments of the subject disclosure.

Turning now to FIG. 7, illustrated is an example block diagram 700 of a receiver device 702 that facilitates an adaptive downlink control channel structure in accordance with various aspects and embodiments of the subject disclosure.

Receiver device 702 can comprise a decoding component 704 that can receive a transport block associated with downlink control information. The decoding component 704 can then determine a code rate of the transport block and also which forward error correction code to use to decode the block. The decoding component 704 can then decode the block using the forward error correction code.

The decoded transport block can then comprise sets of bits that among other things can indicate localized/distributed VRB assignment flag, resource block assignments, modulation and coding schemes, HARQ process numbers, new data indicators, redundancy version indicator, TPC command for uplink control channels, downlink assignment index, precoding matrix index, and number of layers. The RV indicator component 706 can determine whether the RV block is present based on the forward error correction code used to decode the block, and then if errors are found by the CRC component 710 during the parity check of the CRC bits, HARQ component 708 can send a NAK indicator to the transmitter to resend the information. If an RV indicator is present, the HARQ component 708 can perform HARQ incremental redundancy, while if no RV indicator is found, HARQ component 708 can perform Chase combining.

Figure 8:
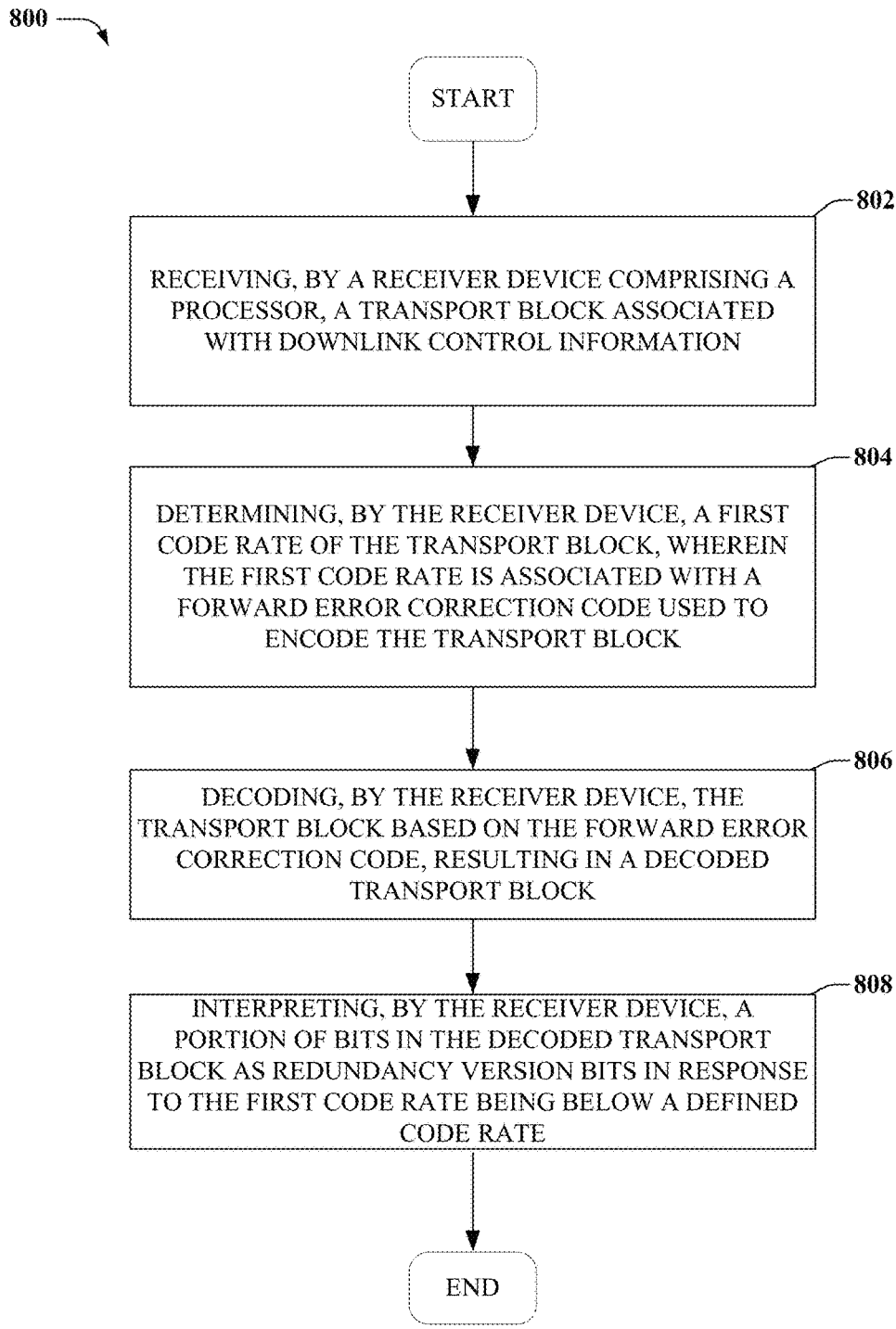
FIG. 8 illustrates an example method for an adaptive downlink control channel in accordance with various aspects and embodiments of the subject disclosure.
Figure 9:
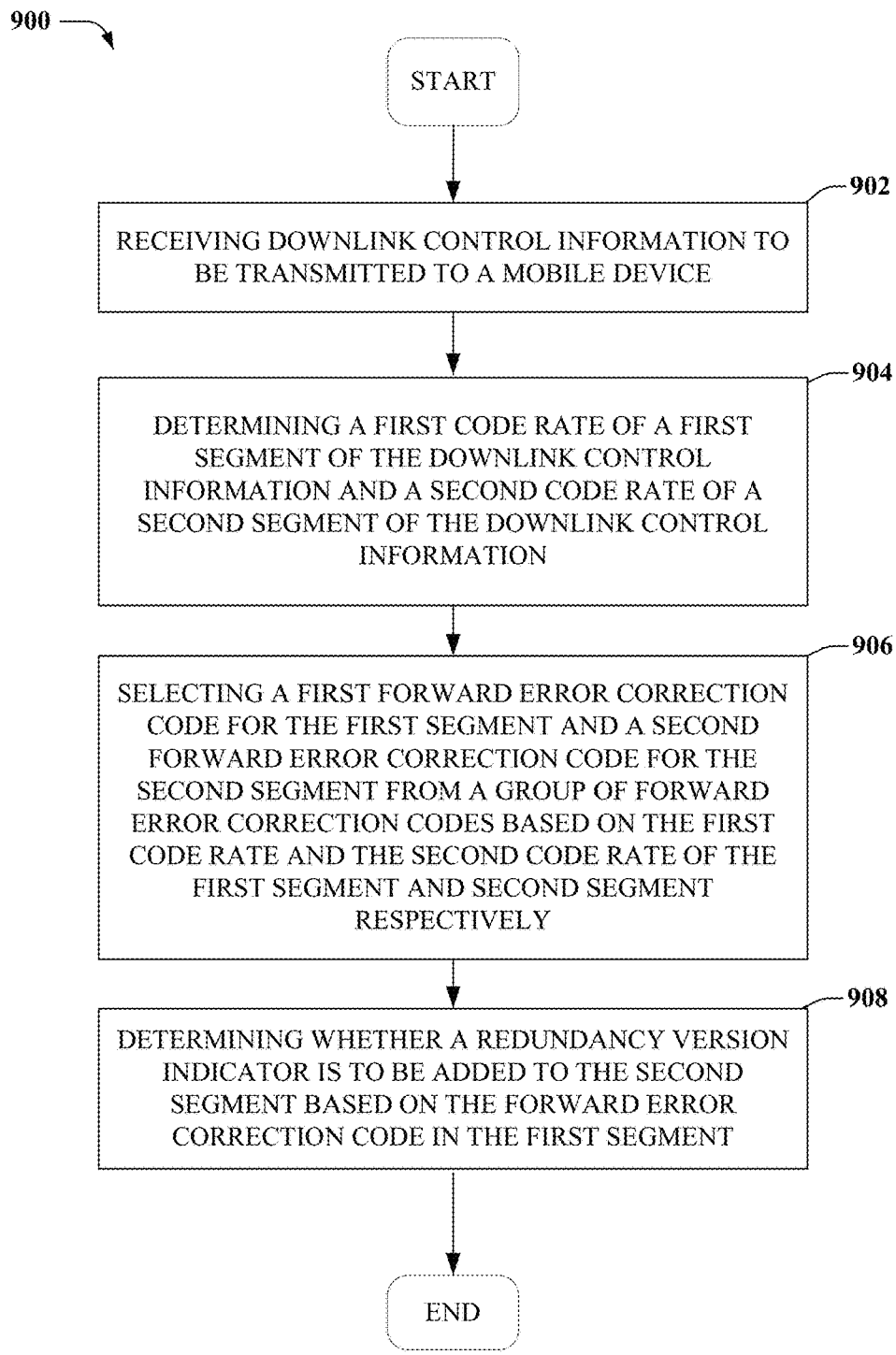
FIG. 9 illustrates an example method for an adaptive downlink control channel in accordance with various aspects and embodiments of the subject disclosure.
Figure 10:
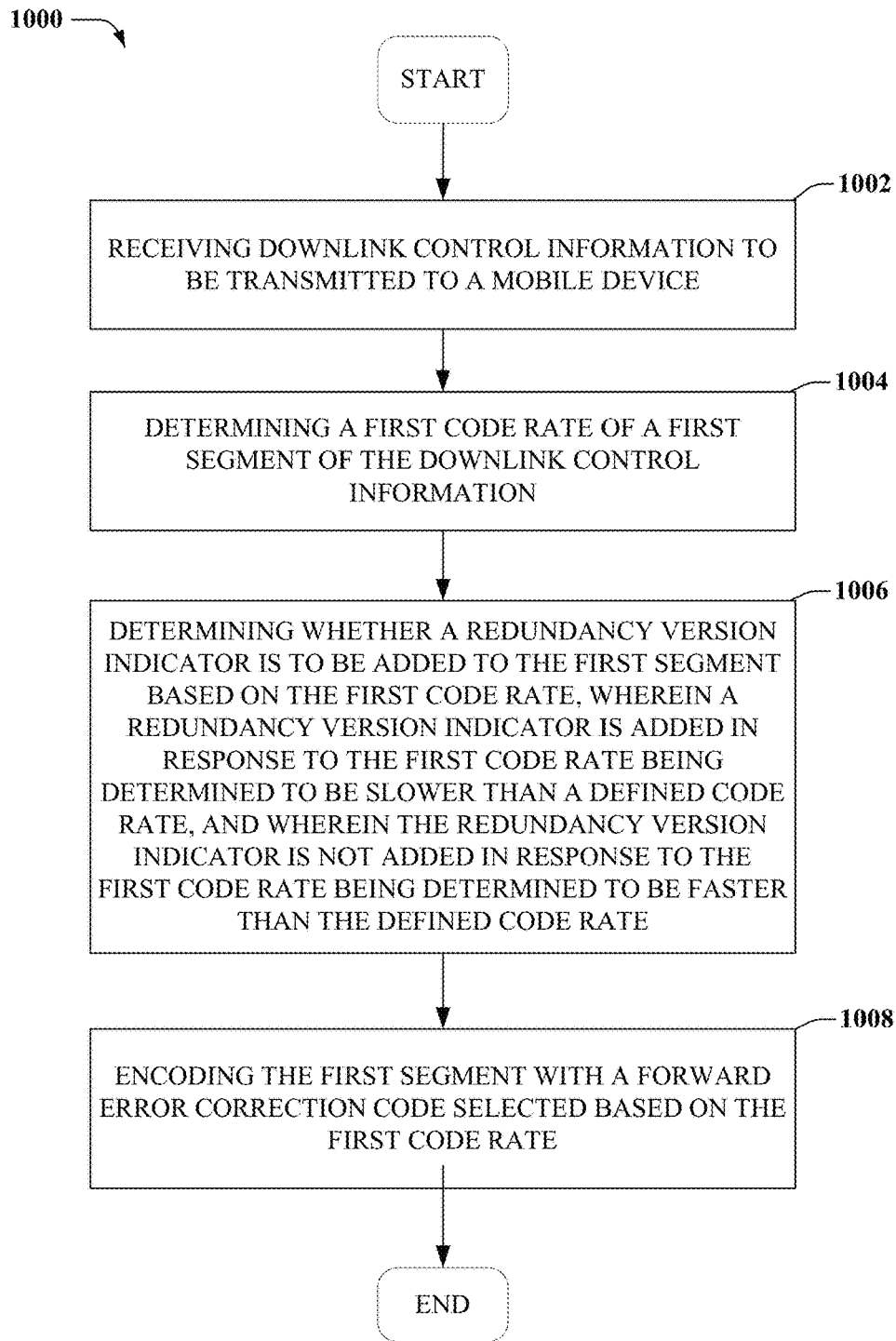
FIG. 10 illustrates an example method for an adaptive downlink control channel in accordance with various aspects and embodiments of the subject disclosure.

FIGS. 8-10 illustrates a process in connection with the aforementioned systems. The process in FIGS. 8-10 can be implemented for example by the systems in FIGS. 1-7 respectively. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Turning now to FIG. 8, illustrated is an example method 800 for facilitating an adaptive downlink control channel in accordance with various aspects and embodiments of the subject disclosure.

Method 800 can start at 802 where the method comprises receiving, by a receiver device comprising a processor, a transport block associated with downlink control information (e.g., by decoding component 704).

At 804 the method comprises determining, by the receiver device, a first code rate of the transport block, wherein the first code rate is associated with a forward error correction code used to encode the transport block (e.g., by decoding component 704).

At 806, the method comprises decoding, by the receiver device, the transport block based on the forward error correction code, resulting in a decoded transport block (e.g., by decoding component 704).

At 808, the method comprises interpreting, by the receiver device, a portion of bits in the decoded transport block as redundancy version bits in response to the first code rate being below a defined code rate (e.g., by RV indicator component 706).

Turning now to FIG. 9, illustrated is an example method 900 for facilitating an adaptive downlink control channel in accordance with various aspects and embodiments of the subject disclosure.

Method 900 can start at 902 where the method comprises receiving downlink control information to be transmitted to a mobile device.

At 904 the method comprises determining a first code rate of a first segment of the downlink control information and a second code rate of a second segment of the downlink control information.

At 906, the method comprises selecting a first forward error correction code for the first segment and a second forward error correction code for the second segment from a group of forward error correction codes based on the first code rate and the second code rate of the first segment and second segment respectively.

At 908, the method comprises determining whether a redundancy version indicator is to be added to the second segment based on the forward error correction code in the first segment.

Turning now to FIG. 10, illustrated is an example method 1000 for facilitating an adaptive downlink control channel in accordance with various aspects and embodiments of the subject disclosure.

Method 1000 can start at 1002 where the method comprises receiving downlink control information to be transmitted to a mobile device.

At 1004 the method comprises determining a first code rate of a first segment of the downlink control information.

At 1006, the method comprises determining whether a redundancy version indicator is to be added to the first segment based on the first code rate, wherein a redundancy version indicator is added in response to the first code rate being determined to be slower than a defined code rate, and wherein the redundancy version indicator is not added in response to the first code rate being determined to be faster than the defined code rate.

At 1008, the method comprises encoding the first segment with a forward error correction code selected based on the first code rate.

Figure 11:
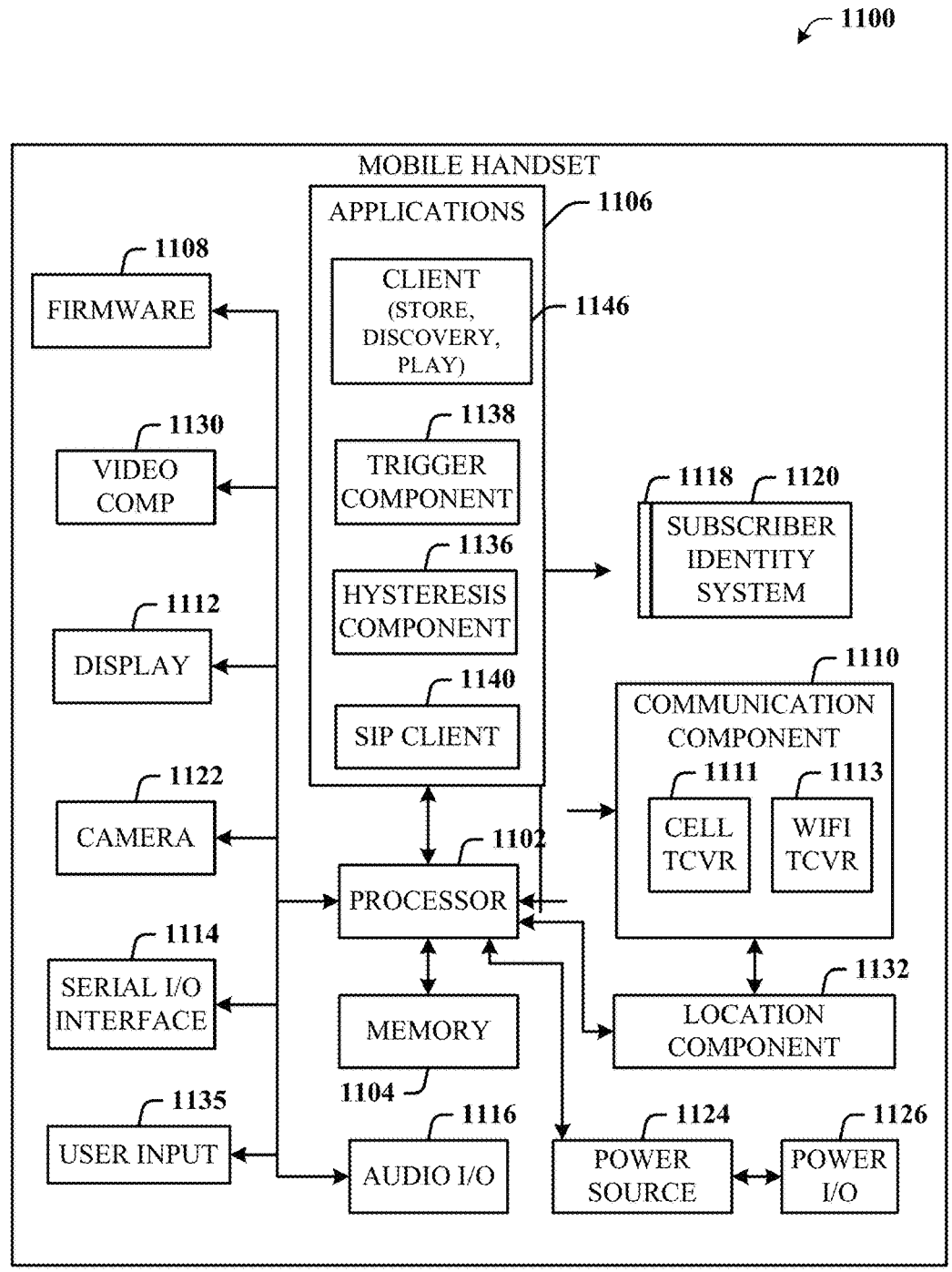
FIG. 11 illustrates an example block diagram of an example user equipment operable to provide an adaptive downlink control channel structure in accordance with various aspects and embodiments of the subject disclosure.

Referring now to FIG. 11, illustrated is a schematic block diagram of an example end-user device such as a user equipment (e.g., mobile device 302 or 304) that can be a mobile device 1100 capable of connecting to a network in accordance with some embodiments described herein. Although a mobile handset 1100 is illustrated herein, it will be understood that other devices can be a mobile device, and that the mobile handset 1100 is merely illustrated to provide context for the embodiments of the various embodiments described herein. The following discussion is intended to provide a brief, general description of an example of a suitable environment 1100 in which the various embodiments can be implemented. While the description comprises a general context of computer-executable instructions embodied on a machine-readable storage medium, those skilled in the art will recognize that the innovation also can be implemented in combination with other program modules and/or as a combination of hardware and software.

Generally, applications (e.g., program modules) can comprise routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically comprise a variety of machine-readable media. Machine-readable media can be any available media that can be accessed by the computer and comprises both volatile and non-volatile media, removable and non-removable media. By way of example and not limitation, computer-readable media can comprise computer storage media and communication media. Computer storage media can comprise volatile and/or non-volatile media, removable and/or non-removable media implemented in any method or technology for storage of information, such as computer-readable instructions, data structures, program modules or other data. Computer storage media can comprise, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and comprises any information delivery media. The term "modulated data signal" means a signal that has one or more of its characteristics set or changed in such a manner as to encode information in the signal. By way of example, and not limitation, communication media comprises wired media such as a wired network or direct-wired connection, and wireless media such as acoustic, RF, infrared and other wireless media. Combinations of the any of the above should also be comprised within the scope of computer-readable media.

The handset 1100 comprises a processor 1102 for controlling and processing all onboard operations and functions. A memory 1104 interfaces to the processor 1102 for storage of data and one or more applications 1106 (e.g., a video player software, user feedback component software, etc.). Other applications can comprise voice recognition of predetermined voice commands that facilitate initiation of the user feedback signals. The applications 1106 can be stored in the memory 1104 and/or in a firmware 1108, and executed by the processor 1102 from either or both the memory 1104 or/and the firmware 1108. The firmware 1108 can also store startup code for execution in initializing the handset 1100. A communications component 1110 interfaces to the processor 1102 to facilitate wired/wireless communication with external systems, e.g., cellular networks, VoIP networks, and so on. Here, the communications component 1110 can also comprise a suitable cellular transceiver 1111 (e.g., a GSM transceiver) and/or an unlicensed transceiver 1113 (e.g., Wi-Fi, WiMax) for corresponding signal communications. The handset 1100 can be a device such as a cellular telephone, a PDA with mobile communications capabilities, and messaging-centric devices. The communications component 1110 also facilitates communications reception from terrestrial radio networks (e.g., broadcast), digital satellite radio networks, and Internet-based radio services networks.

The handset 1100 comprises a display 1112 for displaying text, images, video, telephony functions (e.g., a Caller ID function), setup functions, and for user input. For example, the display 1112 can also be referred to as a "screen" that can accommodate the presentation of multimedia content (e.g., music metadata, messages, wallpaper, graphics, etc.). The display 1112 can also display videos and can facilitate the generation, editing and sharing of video quotes. A serial I/O interface 1114 is provided in communication with the processor 1102 to facilitate wired and/or wireless serial communications (e.g., USB, and/or IEEE 1394) through a hardwire connection, and other serial input devices (e.g., a keyboard, keypad, and mouse). This supports updating and troubleshooting the handset 1100, for example. Audio capabilities are provided with an audio I/O component 1116, which can comprise a speaker for the output of audio signals related to, for example, indication that the user pressed the proper key or key combination to initiate the user feedback signal. The audio I/O component 1116 also facilitates the input of audio signals through a microphone to record data and/or telephony voice data, and for inputting voice signals for telephone conversations.

The handset 1100 can comprise a slot interface 1118 for accommodating a SIC (Subscriber Identity Component) in the form factor of a card Subscriber Identity Module (SIM) or universal SIM 1120, and interfacing the SIM card 1120 with the processor 1102. However, it is to be appreciated that the SIM card 1120 can be manufactured into the handset 1100, and updated by downloading data and software.

The handset 1100 can process IP data traffic through the communication component 1110 to accommodate IP traffic from an IP network such as, for example, the Internet, a corporate intranet, a home network, a person area network, etc., through an ISP or broadband cable provider. Thus, VoIP traffic can be utilized by the handset 800 and IP-based multimedia content can be received in either an encoded or decoded format.

A video processing component 1122 (e.g., a camera) can be provided for decoding encoded multimedia content. The video processing component 1122 can aid in facilitating the generation, editing and sharing of video quotes. The handset 1100 also comprises a power source 1124 in the form of batteries and/or an AC power subsystem, which power source 1124 can interface to an external power system or charging equipment (not shown) by a power I/O component 1126.

The handset 1100 can also comprise a video component 1130 for processing video content received and, for recording and transmitting video content. For example, the video component 1130 can facilitate the generation, editing and sharing of video quotes. A location tracking component 1132 facilitates geographically locating the handset 1100. As described hereinabove, this can occur when the user initiates the feedback signal automatically or manually. A user input component 1134 facilitates the user initiating the quality feedback signal. The user input component 1134 can also facilitate the generation, editing and sharing of video quotes. The user input component 1134 can comprise such conventional input device technologies such as a keypad, keyboard, mouse, stylus pen, and/or touch screen, for example.

Referring again to the applications 1106, a hysteresis component 1136 facilitates the analysis and processing of hysteresis data, which is utilized to determine when to associate with the access point. A software trigger component 1138 can be provided that facilitates triggering of the hysteresis component 1138 when the Wi-Fi transceiver 1113 detects the beacon of the access point. A SIP client 1140 enables the handset 1100 to support SIP protocols and register the subscriber with the SIP registrar server. The applications 1106 can also comprise a client 1142 that provides at least the capability of discovery, play and store of multimedia content, for example, music.

The handset 1100 can comprise an indoor network radio transceiver 1113 (e.g., Wi-Fi transceiver). This function supports the indoor radio link, such as IEEE 802.11, for the dual-mode GSM handset 1100. The handset 1100 can accommodate at least satellite radio services through a handset that can combine wireless voice and digital radio chipsets into a single handheld device.

Figure 12:
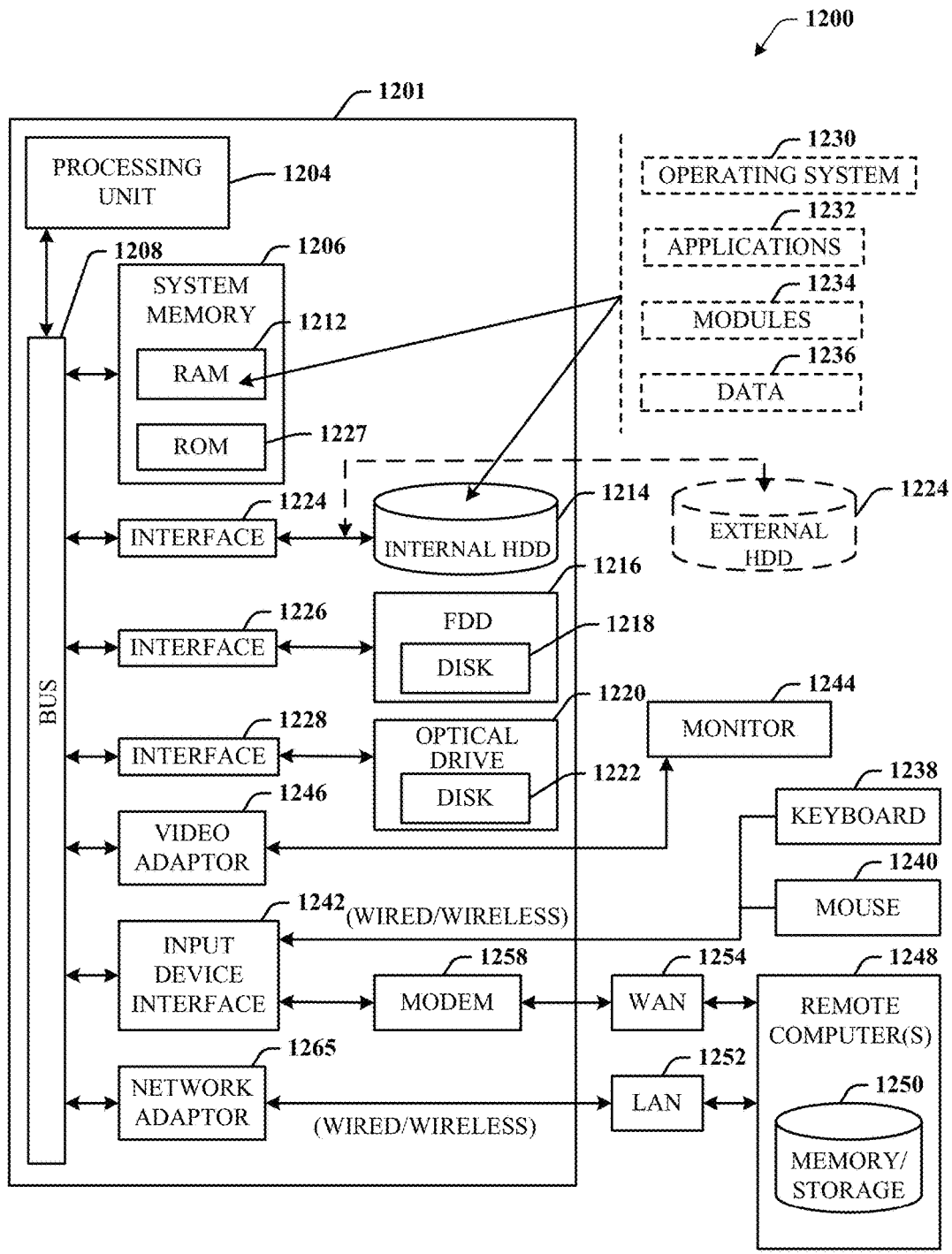
FIG. 12 illustrates an example block diagram of a computer that can be operable to execute processes and methods in accordance with various aspects and embodiments of the subject disclosure.

Referring now to FIG. 12, there is illustrated a block diagram of a computer 1200 operable to execute the functions and operations performed in the described example embodiments. For example, a network node (e.g., network node 206) may contain components as described in FIG. 12. The computer 1200 can provide networking and communication capabilities between a wired or wireless communication network and a server and/or communication device. In order to provide additional context for various aspects thereof, FIG. 12 and the following discussion are intended to provide a brief, general description of a suitable computing environment in which the various aspects of the innovation can be implemented to facilitate the establishment of a transaction between an entity and a third party. While the description above is in the general context of computer-executable instructions that can run on one or more computers, those skilled in the art will recognize that the innovation also can be implemented in combination with other program modules and/or as a combination of hardware and software.

Generally, program modules comprise routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the innovation can also be practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference to FIG. 12, implementing various aspects described herein with regards to the end-user device can comprise a computer 1200, the computer 1200 including a processing unit 1204, a system memory 1206 and a system bus 1208. The system bus 1208 couples system components including, but not limited to, the system memory 1206 to the processing unit 1204. The processing unit 1204 can be any of various commercially available processors. Dual microprocessors and other multi-processor architectures can also be employed as the processing unit 1204.

The system bus 1208 can be any of several types of bus structure that can further interconnect to a memory bus (with or without a memory controller), a peripheral bus, and a local bus using any of a variety of commercially available bus architectures. The system memory 1206 comprises read-only memory (ROM) 1227 and random access memory (RAM) 1212. A basic input/output system (BIOS) is stored in a non-volatile memory 1227 such as ROM, EPROM, EEPROM, which BIOS contains the basic routines that help to transfer information between elements within the computer 1200, such as during start-up. The RAM 1212 can also comprise a high-speed RAM such as static RAM for caching data.

The computer 1200 further comprises an internal hard disk drive (HDD) 1214 (e.g., EIDE, SATA), which internal hard disk drive 1214 can also be configured for external use in a suitable chassis (not shown), a magnetic floppy disk drive (FDD) 1216, (e.g., to read from or write to a removable diskette 1218) and an optical disk drive 1220, (e.g., reading a CD-ROM disk 1222 or, to read from or write to other high capacity optical media such as the DVD). The hard disk drive 1214, magnetic disk drive 1216 and optical disk drive 1220 can be connected to the system bus 1208 by a hard disk drive interface 1224, a magnetic disk drive interface 1226 and an optical drive interface 1228, respectively. The interface 1224 for external drive implementations comprises at least one or both of Universal Serial Bus (USB) and IEEE 1294 interface technologies. Other external drive connection technologies are within contemplation of the subject innovation.

The drives and their associated computer-readable media provide nonvolatile storage of data, data structures, computer-executable instructions, and so forth. For the computer 1200 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 1200, such as zip drives, magnetic cassettes, flash memory cards, cartridges, and the like, can also be used in the example operating environment, and further, that any such media can contain computer-executable instructions for performing the methods of the disclosed innovation.

A number of program modules can be stored in the drives and RAM 1212, including an operating system 1230, one or more application programs 1232, other program modules 1234 and program data 1236. All or portions of the operating system, applications, modules, and/or data can also be cached in the RAM 1212. It is to be appreciated that the innovation can be implemented with various commercially available operating systems or combinations of operating systems.

A user can enter commands and information into the computer 1200 through one or more wired/wireless input devices, e.g., a keyboard 1238 and a pointing device, such as a mouse 1240. Other input devices (not shown) may comprise a microphone, an IR remote control, a joystick, a game pad, a stylus pen, touch screen, or the like. These and other input devices are often connected to the processing unit 1204 through an input device interface 1242 that is coupled to the system bus 1208, but can be connected by other interfaces, such as a parallel port, an IEEE 1394 serial port, a game port, a USB port, an IR interface, etc.

A monitor 1244 or other type of display device is also connected to the system bus 1208 through an interface, such as a video adapter 1246. In addition to the monitor 1244, a computer 1200 typically comprises other peripheral output devices (not shown), such as speakers, printers, etc.

The computer 1200 can operate in a networked environment using logical connections by wired and/or wireless communications to one or more remote computers, such as a remote computer(s) 1248. The remote computer(s) 1248 can be a workstation, a server computer, a router, a personal computer, portable computer, microprocessor-based entertainment device, a peer device or other common network node, and typically comprises many or all of the elements described relative to the computer, although, for purposes of brevity, only a memory/storage device 1250 is illustrated. The logical connections depicted comprise wired/wireless connectivity to a local area network (LAN) 1252 and/or larger networks, e.g., a wide area network (WAN) 1254. Such LAN and WAN networking environments are commonplace in offices and companies, and facilitate enterprise-wide computer networks, such as intranets, all of which may connect to a global communications network, e.g., the Internet.

When used in a LAN networking environment, the computer 1200 is connected to the local network 1252 through a wired and/or wireless communication network interface or adapter 1256. The adapter 1256 may facilitate wired or wireless communication to the LAN 1252, which may also comprise a wireless access point disposed thereon for communicating with the wireless adapter 1256.

When used in a WAN networking environment, the computer 1200 can comprise a modem 1258, or is connected to a communications server on the WAN 1254, or has other means for establishing communications over the WAN 1254, such as by way of the Internet. The modem 1258, which can be internal or external and a wired or wireless device, is connected to the system bus 1208 through the input device interface 1242. In a networked environment, program modules depicted relative to the computer, or portions thereof, can be stored in the remote memory/storage device 1250. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This comprises at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE802.11 (a, b, g, n, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 11 Mbps (802.11b) or 54 Mbps (802.11a) data rate, for example, or with products that contain both bands (dual band), so the networks can provide real-world performance similar to the basic "10BaseT" wired Ethernet networks used in many offices.

As used in this application, the terms "system," "component," "interface," and the like are generally intended to refer to a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. These components also can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry that is operated by software or firmware application(s) executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. An interface can comprise input/output (I/O) components as well as associated processor, application, and/or API components.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also can be implemented as a combination of computing processing units.

In the subject specification, terms such as "store," "data store," "data storage," "database," "repository," "queue", and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory. In addition, memory components or memory elements can be removable or stationary. Moreover, memory can be internal or external to a device or component, or removable or stationary. Memory can comprise various types of media that are readable by a computer, such as hard-disc drives, zip drives, magnetic cassettes, flash memory cards or other types of memory cards, cartridges, or the like.

By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated example aspects of the embodiments. In this regard, it will also be recognized that the embodiments comprises a system as well as a computer-readable medium having computer-executable instructions for performing the acts and/or events of the various methods.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communications media comprise wired media, such as a wired network or direct-wired connection, and wireless media such as acoustic, RF, infrared and other wireless media Further, terms like "user equipment," "user device," "mobile device," "mobile," station," "access terminal," "terminal," "handset," and similar terminology, generally refer to a wireless device utilized by a subscriber or user of a wireless communication network or service to receive or convey data, control, voice, video, sound, gaming, or substantially any data-stream or signaling-stream. The foregoing terms are utilized interchangeably in the subject specification and related drawings. Likewise, the terms "access point," "node B," "base station," "evolved Node B," "cell," "cell site," and the like, can be utilized interchangeably in the subject application, and refer to a wireless network component or appliance that serves and receives data, control, voice, video, sound, gaming, or substantially any data-stream or signaling-stream from a set of subscriber stations. Data and signaling streams can be packetized or frame-based flows. It is noted that in the subject specification and drawings, context or explicit distinction provides differentiation with respect to access points or base stations that serve and receive data from a mobile device in an outdoor environment, and access points or base stations that operate in a confined, primarily indoor environment overlaid in an outdoor coverage area. Data and signaling streams can be packetized or frame-based flows.

Furthermore, the terms "user," "subscriber," "customer," "consumer," and the like are employed interchangeably throughout the subject specification, unless context warrants particular distinction(s) among the terms. It should be appreciated that such terms can refer to human entities, associated devices, or automated components supported through artificial intelligence (e.g., a capacity to make inference based on complex mathematical formalisms) which can provide simulated vision, sound recognition and so forth. In addition, the terms "wireless network" and "network" are used interchangeable in the subject application, when context wherein the term is utilized warrants distinction for clarity purposes such distinction is made explicit.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while a particular feature may have been disclosed with respect to only one of several implementations, such feature may be combined with one or more other features of the other implementations as may be desired and advantageous for any given or particular application. Furthermore, to the extent that the terms "comprises" and "including" and variants thereof are used in either the detailed description or the claims, these terms are intended to be inclusive in a manner similar to the term "comprising."

The above descriptions of various embodiments of the subject disclosure and corresponding figures and what is described in the Abstract, are described herein for illustrative purposes, and are not intended to be exhaustive or to limit the disclosed embodiments to the precise forms disclosed. It is to be understood that one of ordinary skill in the art may recognize that other embodiments having modifications, permutations, combinations, and additions can be implemented for performing the same, similar, alternative, or substitute functions of the disclosed subject matter, and are therefore considered within the scope of this disclosure. Therefore, the disclosed subject matter should not be limited to any single embodiment described herein, but rather should be construed in breadth and scope in accordance with the claims below.

What is claimed is:

1. A system, comprising:
   a processor; and
   a memory that stores executable instructions that, when executed by the processor, facilitate performance of operations, comprising:

receiving downlink control information to be transmitted to a mobile device; determining a code rate of the downlink control information;

selecting a first forward error correction code for a first portion of a transport block for the downlink control information and a second forward error correction code for a second portion of the transport block from a group of forward error correction codes based on the code rate of the downlink control information; and determining whether a redundancy version indicator is to be added between the first portion and the second portion based on the first forward error correction code in the first portion.

2. The system of claim 1, wherein the determining whether the redundancy version indicator is to be added comprises determining that the redundancy version indicator is to be absent from the transport block, and wherein the first portion and the second portion are identical based on the redundancy version indicator being absent.

3. The system of claim 2, wherein the redundancy version indicator being absent signals that a type of hybrid automatic repeat request for the second portion is chase combining.

4. The system of claim 2, wherein the determining whether the redundancy version indicator is to be added comprises determining that the first portion is encoded based on a defined type of forward error correction code.

5. The system of claim 2, wherein the first forward error correction code is a low density parity check type 1 code.

6. The system of claim 1, wherein the determining whether the redundancy version indicator is to be added comprises adding the redundancy version indicator between the first portion and the second portion, and wherein the first portion and the second portion are different based on the redundancy version indicator being added between the first portion and the second portion.

7. The system of claim 6, wherein the redundancy version indicator being added between the first portion and the second portion signals that a type of hybrid automatic repeat request for the second portion is incremental redundancy.

8. The system of claim 6, wherein the determining whether the redundancy version indicator is to be added comprises determining that the first portion is encoded based on a defined type of forward error correction code.

9. The system of claim 6, wherein the first forward error correction code is at least one of a turbo code or a low density parity check type 2 code.

10. A method comprising:

receiving, by a receiver device comprising a processor, a transport block associated with downlink control information;

determining, by the receiver device, a code rate of the transport block, wherein the code rate is associated with a forward error correction code used to encode the transport block;

decoding, by the receiver device, the transport block based on the forward error correction code, resulting in a decoded transport block; and interpreting, by the receiver device, a portion of bits between a first portion in the decoded transport block and a second portion in the decoded transport block as redundancy version bits in response to the code rate being below a defined code rate.

11. The method of claim 10, wherein the code rate is a first code rate, wherein the decoded transport block is a first transport block, and wherein the interpreting further comprises:

interpreting the portion of bits as the redundancy version bits based on a second code rate of a second transport block received prior to the first transport block being below the defined code rate.

12. The method of claim 10, further comprising:

interpreting, by the receiver device, the portion of bits in the decoded transport block as control channel information in response to the first code rate being above a defined code rate.

13. The method of claim 10, further comprising:

decoding, by the receiver device, the transport block with a low density parity check type 1 code in response to the first code rate being above the defined code rate.

14. The method of claim 10, further comprising:

decoding, by the receiver device, the transport block with a low density parity check type 2 code or a turbo code in response to the first code rate being below the defined code rate.

15. A non-transitory machine-readable storage medium, comprising executable instructions that, when executed by a processor of a device, facilitate performance of operations, comprising:

receiving downlink control information to be transmitted to a mobile device;

determining a code rate for a transport block associated with the downlink control information;

determining whether a redundancy version indicator is to be added between a first portion of the transport block and a second portion of the transport block based on the code rate, wherein a redundancy version indicator is added in response to the code rate being determined to be slower than a defined code rate, and wherein the redundancy version indicator is not added in response to the code rate being determined to be faster than the defined code rate; and encoding the first portion with a forward error correction code selected based on the code rate.

16. The non-transitory machine-readable storage medium of claim 15, wherein the encoding the first portion with the forward error correction code comprises encoding the first portion with a low density parity check type 1 code in response to the code rate being faster than the defined code rate.

17. The non-transitory machine-readable storage medium of claim 15, wherein the encoding the first portion with the forward error correction code comprises encoding the first portion with a low density parity check type 2 or a turbo code in response to the code rate being slower than the defined code rate.

18. The non-transitory machine-readable medium of claim 15, wherein the code rate is a first code rate, wherein the downlink control information is first downlink control information, wherein the redundancy version indicator is a first redundancy version indicator, and wherein the operations further comprise:

determining whether a second redundancy version indicator is to be added to the transport block based on a second code rate of second downlink control information received prior to the first downlink control information.

19. The non-transitory machine-readable medium of claim 15, wherein the redundancy version indicator being absent is associated with hybrid automatic repeat chase combining.

20. The non-transitory machine-readable medium of claim 15, wherein the redundancy version indicator being present is associated with hybrid automatic repeat request incremental redundancy.

* * * * *